United States Patent [19]

Takayama

[11] 4,306,200
[45] Dec. 15, 1981

[54] SELECTIVE AMPLIFIER

[75] Inventor: Kazuo Takayama, Kobe, Japan

[73] Assignee: Fujitsu Ten Limited, Kobe, Japan

[21] Appl. No.: 96,068

[22] Filed: Nov. 20, 1979

[30] Foreign Application Priority Data

Dec. 6, 1978 [JP] Japan ............................... 53-151339
Dec. 6, 1978 [JP] Japan ............................... 53-151340

[51] Int. Cl.³ ............................................. H03F 3/193
[52] U.S. Cl. ..................................... 330/277; 330/293;
330/306
[58] Field of Search ............... 330/167, 185, 189, 277,
330/293, 302, 306

[56] References Cited

U.S. PATENT DOCUMENTS 3,164,780  1/1965  Ranky ............................ 330/189 X Primary Examiner—James B. Mullins
Attorney, Agent, or Firm—Oblon, Fisher, Spivak, McClelland & Maier

[57] ABSTRACT

A selective amplifier whose gain characteristic is rendered approximately uniform over the entire frequency band to be amplified with no degradation in the S/N ratio. The amplifier consists of a band-pass filter and an amplifying element, in which a resistor for eliminating the ripples in the transmission characteristic of the filter is constituted with a feed back resistor for the amplifying element, the coil for the parallel resonance circuit in the filter is constituted as an auto-transformer and the capacitor in the serial resonance circuit of said filter is formed with the capacitance of a capacitive antenna respectively to thereby improve the S/N ratio. The amplifier is suitable to be used at the top of the high frequency stages in a radio receiver.

6 Claims, 14 Drawing Figures

SELECTIVE AMPLIFIER

TECHNICAL FIELD

This invention concerns a selective amplifier suitable for use in high frequency stages of a radio receiver.

BACKGROUND OF ART

Selective amplifiers having band-pass characteristic for use in the antenna input in the high frequency stages of a radio receiver include such one as shown in FIG. 1 consisting of a band-pass filter BPF and an amplifier AMP connected in cascade. In this case, the filter BPF is generally disposed before the amplifier AMP so as not to be influenced by a high level input of radiowaves out of the receiving band. While a filter BPF having, in combination, a serial resonance circuit composed of a capacitor $C_A$ and a coil $L_A$ and a parallel resonance circuit composed of a capacitor $C_B$ and a coil $L_B$ as shown in FIG. 2 is generally used, a great ripple appears in a frequency/transmission characteristic as shown in FIG. 3 if the aimed passing frequency range is relatively broader with respect to its center frequency, that is, if the specific band width is great, and the filter circuit is not preferred as such. Specifically, in the example shown in FIG. 3, since the magnitude of transmission is remarkably increased at both of the shoulders of the characteristic curve and it goes as high as to 20-30 dB in the extreme case, the uniform gain characteristic can not be obtained within the band.

In view of the above, a load resistor $R_L$ is connected between the filter output terminal P and the ground, i.e., in parallel with the filter elements $C_B$ and $L_B$ in the parallel resonance circuit as shown in FIG. 4 so that the transmission characteristic may be unified in the band as shown in FIG. 5. In such a structure, however, if the specific band width is near 1, for example, where the central frequency is 1000 KHz and the pass band is set as ±500 KHz relative thereto, i.e., from 500 KHz to 1500 KHz, the value of the resistor $R_L$ is set to a considerably small value to significantly decrease the gain and, as a result, thermal noises due to the resistor $R_L$ is relatively increased to remarkably lower the S/N ratio in the circuit.

It is now examined how the S/N ratio varies depending on the resistor $R_L$ in the circuit shown in FIG. 4 assuming that the coils $L_A$ and $L_B$ and capacitors $C_A$ and $C_B$ produce no losses and the amplifier AMP produces no noises. Assuming the series impedance of the capacitor $C_A$ and the coils $L_A$ as $Z_A$, the parallel impedance of the capacitor $C_B$ and the coil $L_B$ as $Z_B$ and the thermal noise voltage of the resistor $R_L$ as $V_N$ in the circuit shown in FIG. 4, the equivalent circuit up to the point P in the FIG. 4 can be represented as in FIG. 6. Here, $E_S$ represents a signal voltage applied to the input terminal IN and $E_O$ is the out put voltage at the point P in FIG. 4. The thermal noise voltage $V_N$ is represented as: $V_N = \sqrt{4kTBR_L}$ in which k is Boltzmann's constant, T is absolute temperature (°K.) and B is band width.

Since the signal voltage $E_S$ is divided by the resultant impedance of the impedance $Z_B$ and the resistor $R_L$ and the impedance $Z_A$, the signal voltage $E_{OS}$ generated at the point P is represented as:

$$E_{OS} = \frac{Z_B R_L}{R_L(Z_A + Z_B) + Z_A Z_B} E_S \quad (1)$$

While on the other hand, since the noise voltage $E_{ON}$ produced at the point P is represented as:

$$E_{ON} = \frac{Z_A Z_B}{R_L(Z_A + Z_B) + Z_A Z_B} \cdot \sqrt{4kTBR_L} \quad (2)$$

the S/N ratio is expressed as:

$$S/N = \frac{E_{OS}}{E_{ON}} = E_S \frac{\sqrt{R_L}}{Z_A \sqrt{4kTB}} \quad (3)$$

While the S/N ratio throughout the entire selective amplifier is also influenced by the noises generated from the amplifier AMP connected behind the filter BPF, it can be seen that the S/N ratio depends on the value of $R_L$ in the structure shown in FIG. 4 excepting the case of $Z_A = 0$ in the equation (3) and that the S/N ratio is decreased more as the value of the resistor $R_L$ is selected smaller. Since a smaller resistor $R_L$ serves to decrease the ripple referred to above more effectively and it is selected to a much smaller value for the specific band, for example, near 1, this has a defect of worsening the S/N ratio although rendering the gain within the band approximately constant in the circuit shown in FIG. 4. Since the impedance $Z_A$ is represented as:

$$Z_A = \frac{1 - \omega^2 L_A C_A}{j\omega C_A} \quad (4)$$

the equation (3) is expressed as:

$$S/N = E_S \frac{j\omega C_A \sqrt{R_L}}{(1 - \omega^2 L_A C_A) \sqrt{4kTB}} \quad (5)$$

As apparent from the equation (5), since the S/N ratio is optimum only at a particular frequency of $1 - \omega^2 L_A C_A = 0$ in the selective amplifier shown in FIG. 4 and it decrease at $Z_A \neq 0$, the S/N characteristic is satisfactory only at a particular frequency as shown by the curve $C_1$ in FIG. 10 and then worsens as it deviates therefrom. Since the S/N characteristic is in proportion to the square root of the load resistor $R_L$, it worsens in proportion to the square root of the resistor $R_L$ as the latter becomes smaller.

While the parallel connection of the load resistor $R_L$ to the parallel resonance circuit can decrease the ripple appearing in the band-pass characteristic of the filter BPF to unify the gain in the pass band of frequency, it also provides a negative effect of lowering the filter output level. Although a particularly high S/N ratio is desired where such selective amplifier is used in the amplifying stage at the top of a receiver, that is, nearest to the antenna, it is inevitable for the S/N reduction depending on the decrease in the gain of the filter BPF due to the load register $R_L$. FIG. 7 shows an equivalent circuit for a circuit where a field effect transistor is employed as the amplifier AMP regarding the noises therein. In this figure, $v_n$ and $i_n$ show a voltage component and a current component of the noises respectively and FET shows an ideal field effect transistor with no noises. While the field effect transistor actually has not infinite but a finite input impedance and the current component $i_n$ represents the noises generated from an equivalent resistor substituting the input impedance (constant current source). The voltage compnent $v_n$ represents the noises generated in the transistor such as SCHOTTKEY noises. As the voltage applied to the point P, that is, the output from the filter BPF decreases, the voltage component $v_n$ is increased relatively to worsen the S/N ratio.

DISCLOSURE OF THE INVENTION

Accordingly, it is a main object of this invention to provide a selective amplifier having an approximately constant gain over the entire frequency range to be amplified while showing no decrease in the S/N ratio.

Another object of this invention is to provide an effective means for improving the S/N ratio where the amplifying element consists of a field effect transistor, and the voltage component of the noises constitutes a greater cause for the reduction in the S/N ratio than the current component thereof.

In accordance with the first feature of this invention, the load resistor connected in parallel with the parallel resonance circuit in a band-pass filter is replaced by a feed back resistor connected between input and output terminals of the amplifier to thereby attain the foregoing main object.

In accordance with the second feature of this invention, the coil in the parallel resonance circuit is formed as a tapped coil, i.e., a transformer, so that the stepped-up filter output is applied to the gate of a field effect transistor as the amplifying element to thereby attain the foregoing another object.

In addition, the capacitor in the serial resonance circuit in the band-pass filter is constituted with a capacitance of a capacitive antenna in this invention to thereby attain a more improvement in the S/N ratio and decrease in the number of element to be used.

These and other objects, as well as features of this invention will be come apparent from the following descriptions referring to the accompanying drawings.

BEST MODE FOR PRACTIZING THE INVENTION

Figure 4:
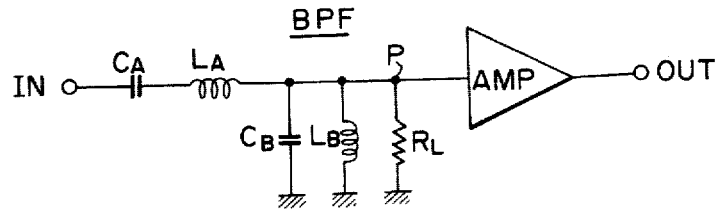
FIG. 4 is a circuit diagram showing the structure of a conventional selective amplifier having an improved transmission characteristic.
Figure 8:
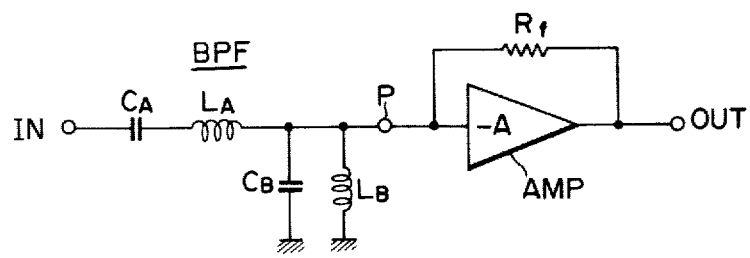
FIG. 8 is a circuit diagram showing a first embodiment of this invention.

Referring to FIG. 8, the figure shows a first embodiment of this invention consisting of, in the same manner as in FIG. 4, a band-pass filter BPF and an amplifier AMP, wherein the filter consists of a serial resonance circuit composed of a capacitor $C_A$ and a coil $L_A$ and a parallel resonance circuit composed of a capacitor $C_B$ and a coil $L_B$, but the load resistor $R_L$ connected in parallel with the parallel resonance circuit is eliminated and, instead, a feed back resistor $R_f$ is used connected between the input and output terminals of the amplifier AMP. An invert amplifier having an input impedance nearly infinite and an output impedance near 0 is preferred as the amplifier AMP whose gain $(-A)$ is represented as: $|A|>>1$. Such an invert amplifier is composed, for example, of a field effect transistor.

Figure 5:
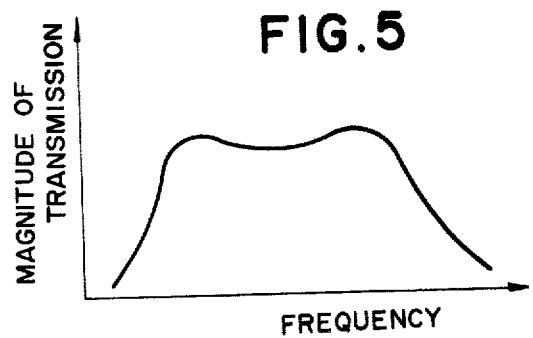
FIG. 5 is a transmission characteristic chart for the amplifier shown in FIG. 4.
Figure 6:
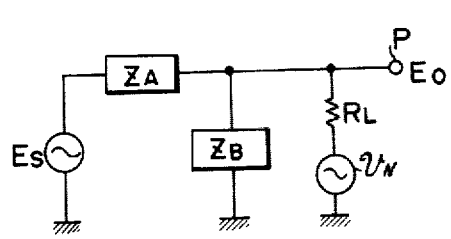
FIG. 6 is an equivalent circuit diagram for the circuit in FIG. 4.
Figure 7:
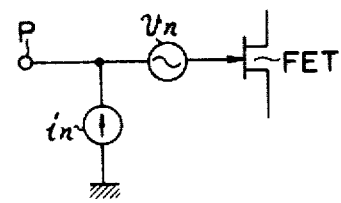
FIG. 7 is an equivalent circuit diagram with respect to noises or the likes in a field effect transistor.
Figure 9:
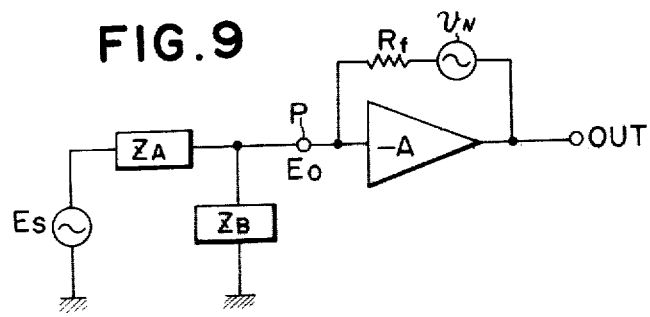
FIG. 9 is an equivalent circuit diagram for the circuit in FIg. 8.

Since the impedance from the point P toward the invert amplifier AMP is $R_f/A$ in the above constitution, it will be apparent that the transmission characteristic shown in FIG. 5 can be obtained by selecting $R_f$ so as to satisfy: $R_f = AR_L$. Now, how the S/N ratio varies depending on the thermal noises in such resistor $R_f$ is to be examined. The circuit shown in FIG. 8 can be represented in an equivalent manner as in FIG. 9 while considering the thermal noise voltage of $R_f$ as: $v_n = \sqrt{4kTBR_f}$. Accordingly, the signal component $E_{os}$ at the point P is represented as:

$$E_{OS} = E_S \frac{Z_B(R_f/A)}{(Z_A + Z_B)(R_f/A) + Z_A Z_B} \quad (6)$$

and the noise component $E_{ON}$ at the point P is represented as:

$$E_{ON} = \frac{Z_A \cdot Z_B/A}{(Z_A + Z_B)(R_f/A) + Z_A Z_B} \sqrt{4kTBR_f} \quad (7)$$

Then, the S/N ratio is represented as:

$$S/N = \frac{E_{OS}}{E_{ON}} = \frac{R_f}{Z_A \sqrt{4kTB}} \cdot E_S \quad (8)$$

Figure 10:
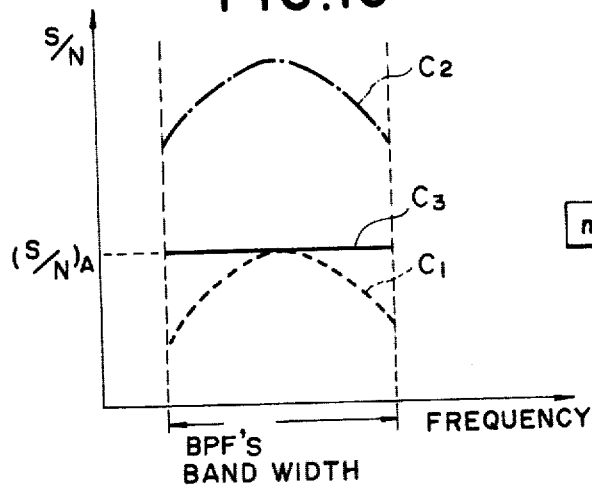
FIG. 10 is a frequency characteristic chart for S/N ratio.

Since $R_f = AR_L$ in the equation (8), the S/N ratio in the selective amplifier in FIg. 8 is better by a factor of about $\sqrt{A}$ as compared with tht in equation (3), and it is represented by the frequency characteristic as a curve $C_2$ in FIG. 10. Actually, since the S/N ratio is determined by the noises of the amplifier AMP when the reduction in the S/N ratio due to the resistor $R_L$ is decreased so much, the overall S/N ratio is shown as the straight line $C_3$ in FIG. 10 and restricted to the noise level (S/N)A of the amplifier AMP, but the S/N ratio is significantly improved at the upper and the lower limits of the frequency band as compared with the conventional S/N curve $C_1$.

Figure 1:
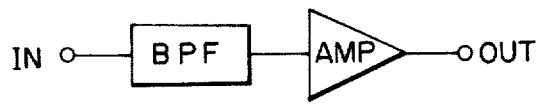
FIG. 1 is a block diagram showing one example of conventional selective amplifiers.
Figure 2:
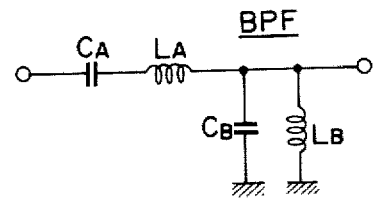
FIG. 2 is a circuit diagram showing one embodiment of the band-pass filter in FIG. 1.
Figure 3:
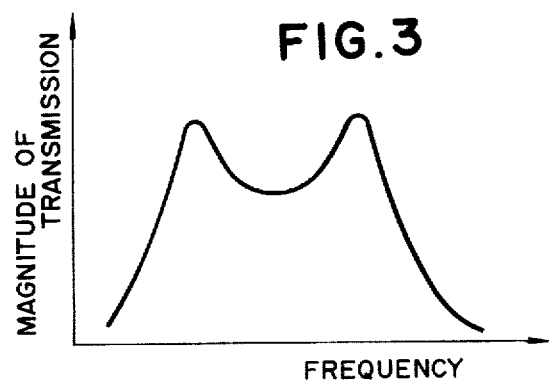
FIG. 3 is a transmission characteristic chart for the selective amplifier shown in FIG. 1.
Figure 12:
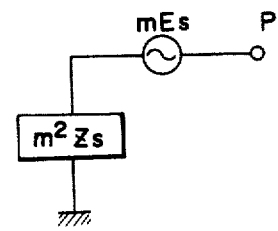
FIG. 12 and FIG. 13 are equivalent circuit diagrams for the circuit in FIG. 11.
Figure 11:
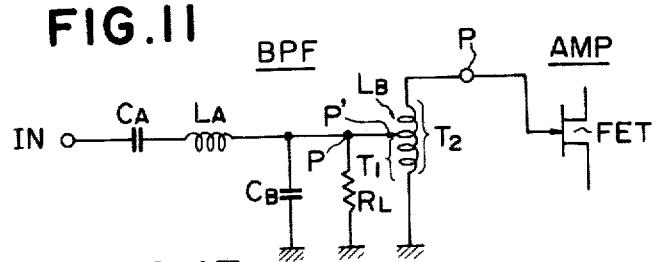
FIG. 11 is a circuit diagram showing a second embodiment of this invention.
Figure 13:
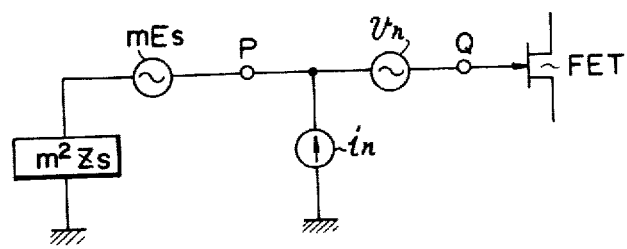

It is possible to improve the S/N ratio by the increase in the input voltage to the amplifier where the noise voltage component is predominent over the noise current component, and such an embodiment is shown in FIG. 11. In the figure, $C_A$ and $L_A$ represent a capacitor and a coil constituting the serial resonance circuit as one of the elements in the band-pass filter BPF as in FIG. 1, $C_B$ represents a capacitor in the parallel resonance circuit in the other element in BPF and $R_L$ is a load resistor. The coil $L_B$ in the parallel resonance circuit is formed as a tapped coil i.e., an auto-transformer in this circuit, in which the input voltage applied to the field effect transistor FET as the amplifying element is stepped up by the winding ratio between the primary and secondary windings: $m = T_2/T_1$. The inductance of the transformer viewed from the tap P' is, of course, equalized to that of the coil $L_B$ in FIG. 1. The equivalent circuit viewed from the point P toward the input side in FIG. 11 can be represented as shown in FIG. 12 with a serial circuit of a signal voltage $mE_S$ which is multiplied by the factor of the winding ratio m and a signal source impedance $m^2Z_S$ which is multiplied by the square of the winding ratio. Taking the noises in the transistor FET also consideration thereto, the circuit shown in FIG. 13 is obtained. In the circuit, $Z_S$ is the impedance of the signal source viewed from the tap P'. The S/N ratio at the point Q in the circuit shown in FIG. 13 is expressed as in the following equation:

$$S/N = \frac{mE_S}{\sqrt{i_n^2 m^4 Z_S^2 + v_n^2}} \quad (9)$$

It can be seen from the equation (9) that the S/N is 0 when $m=0$ or $m=\infty$ and becomes the maximum at a value therebetween. The value for m which gives the maximum S/N ratio is a value which renders the result to zero in the differentiation for the S/N ratio as the function f(m) with m, that is, the value satisfying: $df(m)/dm = 0$, and it is represented by the following equation:

$$m = \sqrt{\frac{v_n}{i_n Z_n}} \quad (10)$$

If the selective amplifier using a field effect transistor as the amplifying element is employed for the input of a high frequency amplifying stage cnnected to a capacitive antenna, $v_n$ is often greater than $i_n Z_S$ and, consequently, the S/N ratio can be increased by setting m greater than 1, that is, by the step-up of the voltage as shown in the equation (10). While the voltage component $v_n$ and the current component $i_n$ of the noises are inherent in the field effect transistor FET, $Z_S$ is an input impedance viewed from the transistor FET and it can be selected or modified to some extent. Inserting the equation (10) into the equation (9) can provide the S/N ratio for the optimum selection for the m and it is shown in the equation (11):

$$S/N = \frac{E_S}{\sqrt{2 i_n Z_S v_n}} \quad (11)$$

As can be seen from above, the S/N ratio increases as $Z_S$ decreases. Then, if the selective amplifier is used to the top stage of a radio receiver having a capacitive antenna, the capacitance of the antenna can be utilized as the entire or a part of the capacitor $C_A$, and this can decrease the number of elements and lower the impedance $Z_S$ as much as possible, and such an embodiment is shown in FIG. 14.

Figure 14:
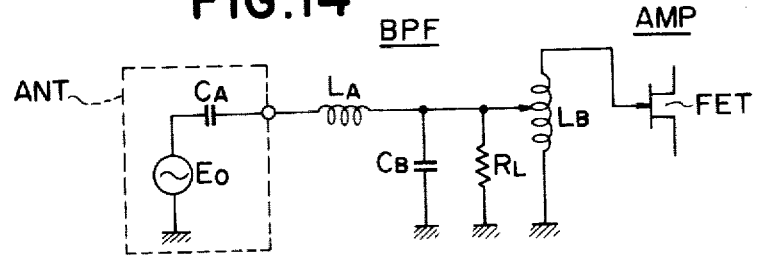
FIG. 14 is a circuit diagram showing a third embodiment of this invention.

In FIG. 14, ANT is a capacitive antenna mounted to automobiles or the likes and it is represented in an equivalent manner with an electromotive force $E_O$ and a serial capacitor $C_A$. The capacitor $C_A$ is used as the serial resonance circuit for the filter BPF in this circuit. $L_A$ is a coil in the serial resonance circuit, $C_B$ is a capacitor in the parallel resonance circuit, $R_L$ is a load resistor, $L_B$ is a coil of the parallel resonance circuit constituted as an autotransformer and FET is a field effect transistor for constituting the amplifier AMP. The operation is the same as that described in FIG. 11 or the like. The load resistor $R_L$ may be connected, in place of, in parallel with the parallel resonance circuit but between the input and output terminals, i.e., between the drain and the gate of the transistor FET so as to function as the feed back resistor $R_f$ shown in FIG. 8. Both of the effects as set forth in FIG. 8 and FIG. 11 can be obtained in this case.

This invention is no way restricted only to those embodiments illustrated and described as foregoings but it can be modified in various manners within the scope of the claim.

What is claimed is:

1. A selective amplifier having a band-pass filter consisting of a serial resonance circuit composed of a capacitor and a coil and a parallel resonance circuit composed of a capacitor and a coil for allowing to pass therethrough those signals within a frequencey range to be amplified by an amplifier, a resistor for smoothing the ripple appearing in the transmission characteristic of the filter and a high gain amplifying element connected to the output of the filter, characterized in that the smoothing resistor has a resistance value equal to a resistance value required for the smoothing of the ripple appearing in the filter transmission characteristic multiplied by the gain of the above amplifying element and it is constituted as a feed back resistor connected between the output terminal and the input terminal of the amplifying element.

2. The selective amplifier as claimed in claim 1, in which the amplifying element is a field effect transistor.

3. A selective amplifier having a band-pass filter consisting of a serial resonance circuit composed of a capacitor and a coil and a parallel resonance circuit composed of a capacitor and a coil for allowing to pass therethrough those signals within a frequency range to be amplified by an amplifier, a resistor for smoothing the ripple appearing in the transmission characteristic of the filter, and a high gain amplifying element connected to the output terminal of the filter, characterized in that a transformer is used for the coil in the parallel resonance circuit, and the amplifying element is a field effect transistor, in which the filter output voltage stepped-up through the transformer is adapted to be inputted to the field effect transistor.

4. The selective amplifier as claimed in claim 3, wherein the capacitor in the serial resonance circuit is formed with a capacitance of a capacitive antenna.

5. The selective amplifier as claimed in claim 3, wherein the transformer is an autotransformer and the input of the autotransformer is connected to the output of the band-pass filter.

6. A selective amplifier having a band-pass filter consisting of a serial resonance circuit composed of a capacitor and a coil and a parallel resonance circuit composed of a capacitor and a coil for allowing to pass therethrough those signals within a frequency range to be amplified by an amplifier, a resistor for smoothing the ripple appearing in the transmission characteristic of the filter and a high gain amplifying element connected to the output terminal of the filter, characterized in that a field effect transistor is used for the amplifying element, the smoothing resistor has a resistance value equal to a resistance value required for the smoothing of the ripple appearing in the transmission characteristic of the filter multiplied by the factor of the gain of the transistor, and it is constituted as a feed back resistor connected between the output terminal and the input terminal of the transistor and a transformer is used for the coil in the parallel resonance circuit, in which the filter output voltage stepped-up through the transformer is adapted to be inputted to the transistor.

* * * * *